United States Patent [19]

Holbrook et al.

[11] 3,997,964
[45] Dec. 21, 1976

[54] PREMATURE BREAKAGE RESISTANT SEMICONDUCTOR WAFER AND METHOD FOR THE MANUFACTURE THEREOF

[75] Inventors: George F. Holbrook, Camillus; Bernard R. Tuft, Scipio Center; Earl C. Williams, Syracuse, all of N.Y.

[73] Assignee: General Electric Company, Syracuse, N.Y.

[22] Filed: Sept. 30, 1974

[21] Appl. No.: 510,354

[52] U.S. Cl. .................................. 29/583; 29/413; 29/580; 219/121 L; 357/55
[51] Int. Cl.² ........................................ H01L 21/302
[58] Field of Search ............... 357/55; 29/413, 580, 29/581, 582, 583; 219/121 L, 121 LM

[56] References Cited
UNITED STATES PATENTS

| | | | |
|---|---|---|---|
| 3,112,850 | 12/1963 | Garibotti | 357/55 |
| 3,241,219 | 3/1966 | Hamm | 29/413 X |
| 3,607,466 | 9/1971 | Miyazaki | 357/59 |
| 3,628,107 | 12/1971 | Kennedy | 357/55 |
| 3,771,028 | 11/1973 | Davis et al. | 357/55 |
| 3,821,782 | 6/1974 | Hutson | 357/55 |
| 3,900,864 | 8/1975 | Dapkus et al. | 357/55 |

*Primary Examiner*—William D. Larkins
*Attorney, Agent, or Firm*—R. J. Mooney; D. E. Stoner

[57] ABSTRACT

Disclosed is a breakage resistant semiconductor wafer and a method for the fabrication thereof. Intersecting grooves are formed on one side of the wafer to facilitate ultimate subdivision thereof. A portion, such as a peripheral portion, of the wafer remains ungrooved. The ungrooved portion substantially increases the strength of the wafer and prevents premature breakage. When it is desired to subdivide the wafer, laser scribe lines are formed on the opposite side of the wafer in registry with the grooves. In an alternate embodiment the second side of the wafer is also grooved. However, the grooves on the second side of the wafer traverse the entirety thereof.

11 Claims, 5 Drawing Figures

PREMATURE BREAKAGE RESISTANT SEMICONDUCTOR WAFER AND METHOD FOR THE MANUFACTURE THEREOF

BACKGROUND OF THE INVENTION

This invention relates to materials and methods for manufacturing semiconductor devices and, more particularly, to a manufacturing method that provides a breakage resistant semiconductor wafer which improves semiconductor device yield by reducing premature wafer breakage.

In the manufacture of semiconductor devices, a plurality of device pellets is generally formed on a single semiconductor wafer by selectively diffusing conductivity altering dopants into selected portions of the wafer. Following the diffusion steps, the wafer must be subdivided to form the individual device pellets. Frequently, passivating material is also applied to the wafer. The passivating material is typically applied in grooves along which the wafer is to be divided and the material may consist of glass or may simply be an oxide formed in the grooves.

A problem frequently encountered by semiconductor device manufacturers is premature breakage of the wafers. For example, during deposition of the passivating material wafer fractures sometimes occur. Such fractures have an adverse effect on device processing inasmuch as semiconductor manufacturers are equipped to handle whole semiconductor wafers and frequently machinery associated with the manufacture of semiconductor devices functions less efficiently when processing only a portion of a wafer. Furthermore, portions of the wafer may be so small that, although several useful, workable devices are included thereon, separate handling of the small fragments is impractical. Also, the fracture itself may destroy several pellets. Consequently the prevention of premature wafer breakage is an important matter to semiconductor device manufacturers.

It is, therefore, an object of this invention to provide a method of subdividing semiconductor wafers that is efficient, permits rapid and accurate subdivision, is compatible with passivation techniques and yet maintains the wafers resistant to premature breakage.

SUMMARY OF THE INVENTION

This invention is characterized by a method of subdividing a semiconductor wafer so as to form a plurality of device pellets. For purposes of the following description, breakage paths will be defined as straight line paths that separate the several device pellets and along which the wafer is to be broken during subdivision. At least one groove is formed in a first surface of the semiconductor wafer along one breakage path. Generally each wafer will comprise a plurality of breakage paths and a groove will be formed along each one. Regardless of the number of grooves formed, a portion of the first surface remains ungrooved. The integrity of the wafer is maintained by the ungrooved portion. Preferably, the ungrooved portion is a peripheral portion which prevents the initiation of cracks at the periphery of the wafer. It is generally at the periphery that cracks which result in premature breakage begin. Thus, the problem of premature breakage is substantially alleviated. When subdivision is desired, laser scribe lines are formed on the opposite side of the wafer with one scribe line in registry with each groove. Following laser scribing, the wafer can quickly and easily be subdivided.

Initial attempts to laser scribe wafers that had ungrooved portions failed. The scribe lines were not adequate and resulting breakage was frequently uncontrolled. It was discovered that the depth of field of the laser focusing equipment was inadequate to properly scribe a partially grooved surface. The subject method overcomes this difficulty by partially grooving one surface and laser scribing the other.

A feature of the subject method is that it is also amenable to semiconductor manufacturing processes in which it is desired to groove both sides of a wafer. When utilizing the method to groove a wafer on both sides, the grooves on the side that is to be scribed traverse the entire wafer surface. With such a groove configuration, the integrity of the wafer is maintained by the ungrooved portion on one side yet effective scribing is assured inasmuch as the scribe lines are completely within grooves and thus little depth of field is needed.

DESCRIPTION OF THE DRAWINGS

These and other features and objects of the present invention will become more apparent upon a perusal of the following description taken in conjunction with the accompanying drawings wherein.

DESCRIPTION OF THE PREFERRED METHOD

Figure 1:
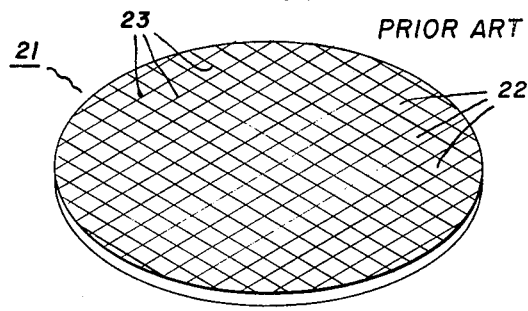
FIG. 1 is an isometric view of a semiconductor wafer scribed in accordance with prior art method.

Referring first to FIG. 1 there is shown an isometric view of a wafer 21 that has been selectively diffused with impurities so as to form regions 22 that, when subdivided, will form individual semiconductor device pellets. The regions 22 are separated by breakage paths. Typically, a plurality of grooves 23 is formed along the breakage paths to separate the regions. Following groove formation, the grooves are frequently passivated by techniques such as oxide growth in the grooves or filling the grooves with a material such as glass or silicone rubber. As is shown in FIG. 1, each groove generally spans the entire surface of the wafer 21.

Figure 2:
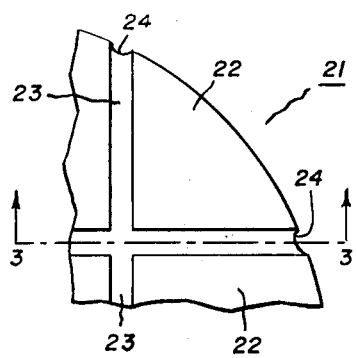
FIGS. 2 and 3 are detailed plan and elevation views of the wafer depicted in FIG. 1.
Figure 3:
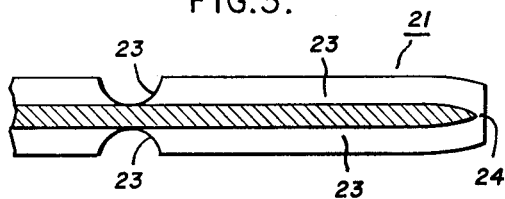

Referring now to FIGS. 2 and 3 there is shown in detail a portion of the wafer 21. Observing the intersection 24 between the groove 23 and the periphery of the wafer 21 in FIG. 2 it will be observed that a generally semicircular cut is formed in the wafer. Observation of FIG. 3 illustrates the cause of this semicircular cut. The grooves are generally formed by etching. The etchant most readily attacks the corners at the periphery of the wafer 21. Consequently, a small rounding effect takes place there. Similarly, the grooves 23 are etched most deeply near the periphery. Thus, the deepened grooves join near the periphery, as shown in FIG. 3, and the semicircular cut is formed. Consequently, it will be appreciated that the premature breakage problem is more severe than might at first be apparent because of the severe weakening near the wafer edges that is caused by the rounding and deep groove etching.

Figure 4:
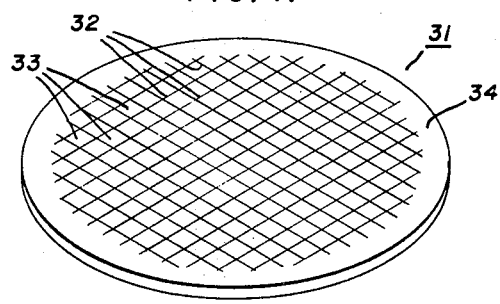
FIG. 4 is an isometric view of a wafer grooved in accordance with the subject method.

Referring now to FIG. 4 there is shown a first surface of a wafer 31 that is etched in accordance with the subject method. A plurality of intersecting grooves 32 separate regions 33, that have been selectively doped so as to form semiconductor device pellets upon wafer subdivision. In addition to the region 33, a peripheral portion 34 of the first side of the wafer 31 remains ungrooved. It is the ungrooved peripheral portion that maintains the integrity of the wafer by both adding strength to the peripheral portion and preventing the semicircular cuts 24 shown in FIG. 2.

When it is desired to subdivide the wafer 31 along the grooves 32 (which coincide with the breakage paths) to separate the regions 33, the wafer, ungrooved second surface up, is placed in a laser scribing apparatus and aligned by conventional methods so that the laser scribe lines on the second surface will be in registry with the grooves 32. This step typically follows passivation. The scribing machine is then activated and forms laser scribe lines on the second surface that span the entirety thereof and are in registry with the grooves 32. Inasmuch as the second surface is ungrooved it will be appreciated that there is no depth of field problem with respect to laser scribing.

If desired the second side of the wafer 31 can be grooved. This may be desired if, for example, both sides are to be passivated. In that event, auxiliary grooves are formed on the second side with one auxiliary groove in registry with each of the grooves 32. The auxiliary grooves span the entirety of the second surface. This is illustrated in FIG. 5 which is a sectional elevation view of a portion of the wafer 31 showing the peripheral portion 34 that is ungrooved with respect to a groove 32 and showing an auxiliary groove 35 that extends to the periphery of the wafer.

Figure 5:
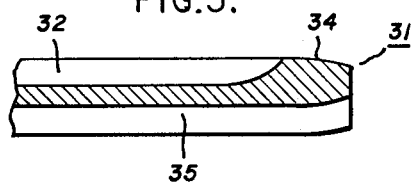
FIG. 5 is a sectional elevation view of a portion of a wafer grooved on both sides in accordance with the subject method.

Observation of FIG. 5 illustrates an advantage provided by the subject method when grooving a wafer on both sides. The auxiliary groove 35 extends to the periphery of the wafer and thus depth of field problems are alleviated. However, the ungrooved portion 34 maintains the integrity of the wafer.

The wafer configuration illustrated in FIG. 5 is slightly more fragile than a wafer grooved on only one side by the method described herein. That is so becuase the auxiliary grooves shown in FIG. 5 extend to the wafer periphery, thus causing some weakness. However, it will be appreciated that regardless of whether one side or two side grooving is desired, wafer strength is enhanced by the above teachings. Specifically, when grooving one side by the prior art techniques, the grooves extend to the periphery, but when grooving on one side by the subject method, no grooves extend to the periphery. Conversely, when grooving both sides in accordance with the prior art, all grooves extend to the periphery and semicircular cuts are formed, however, when employing the present teachings, the grooves on only one side extend to the periphery and no semicircular cuts are formed.

In view of the foregoing, many modifications and variations of the subject invention will be apparent to those skilled in the art. It is to be understood, therefore, that the invention will be limited only by the following claims.

What is claimed is:

1. A method of subdividing a semiconductor wafer into a plurality of semiconductor pellets, said method comprising the steps of:
   providing a semiconductor wafer having a first surface and a second surface;
   forming at least one groove in said first surface of said wafer, wherein a portion of said first surface remains ungrooved during the grooving process;
   laser scribing said second surface of said wafer with at least one scribe line which is in registry with said at least one groove and wherein said scribe line traverses the entire said second surface of said wafer.

2. A method according to claim 1 wherein said forming step comprises forming a plurality of grooves on said first surface while maintaining said portion ungrooved, and wherein said step of laser scribing comprises a plurality of scribe lines on said second surface, each of said scribe lines being in registry with one of said grooves and traversing the entire said second surface.

3. A method according to claim 2 wherein said portion which remains ungrooved comprises a peripheral portion.

4. A method according to claim 3 comprising, following said step of laser scribing, a step of breaking said wafer along said plurality of scribe lines so as to form a plurality of semiconductor pellets.

5. A method according to claim 4 wherein said wafer is selectively doped with impurities such that each of said pellets comprises a semiconductor device pellet.

6. A method according to claim 1 wherein said step of forming at least one groove further comprises forming at least one auxiliary groove on said second surface, wherein said auxiliary groove is in registry with said groove and said auxiliary groove is formed in the region of said second surface that is opposite said portion that remains ungrooved and wherein said scribe line is formed in said auxiliary groove.

7. A method according to claim 6 wherein said forming step comprises forming a plurality of grooves on said first surface and a plurality of auxiliary grooves on said second surface, each of said auxiliary grooves being in registry with one of said grooves, wherein each of said auxiliary grooves traverses the entirety of said second surface, and wherein, during said laser scribing step, said scribe lines are formed in said auxiliary grooves.

8. A method according to claim 7 wherein said portion which remains ungrooved comprises a peripheral portion.

9. A method according to claim 8 comprising, following said step of laser scribing, a step of breaking said wafer along said plurality of scribe lines so as to form a plurality of semiconductor pellets.

10. A method of subdividing a semiconductor wafer into a plurality of semiconductor pellets comprising the steps of:
   providing a semiconductor wafer that has been selectively doped with impurities so as to form, when subdivided, a plurality of semiconductor device pellets, said wafer having a first surface and a second surface;
   forming on said first surface of said wafer a plurality of intersecting grooves that separate the several areas of said wafer that will constitute said device pellets and wherein a portion of said first surface other than said several areas remains ungrooved;
   forming, on said second surface, a plurality of auxiliary grooves, each of said auxiliary grooves being in registry with one of said grooves, but wherein said auxiliary grooves traverse the entirety of said second surface thus grooving the area of said second surface opposite said portion of said first surface that remains ungrooved;
laser scribing a scribe line in each of said auxiliary grooves for the entire length thereof; and
subdividing said wafer along each of said scribe lines.

11. A method according to claim 10 wherein said portion which remains ungrooved comprises a peripheral portion.

* * * * *